US008852986B2

(12) United States Patent
Kuan et al.

(10) Patent No.: US 8,852,986 B2
(45) Date of Patent: Oct. 7, 2014

(54) INTEGRATED CIRCUIT PACKAGE SYSTEM EMPLOYING RESILIENT MEMBER MOLD SYSTEM TECHNOLOGY

(75) Inventors: Heap Hoe Kuan, Singapore (SG); Pei Ee Chua, Singapore (SG); Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 1203 days.

(21) Appl. No.: 11/749,717

(22) Filed: May 16, 2007

(65) Prior Publication Data

US 2008/0284066 A1  Nov. 20, 2008

(51) Int. Cl.
*H01L 23/31* (2006.01)

(52) U.S. Cl.
USPC ............. 438/64; 257/667; 257/787; 257/737; 257/780; 438/127

(58) Field of Classification Search
None
See application file for complete search history.

(56) References Cited

U.S. PATENT DOCUMENTS

| | | | | |
|---|---|---|---|---|
| 5,108,955 A | * | 4/1992 | Ishida et al. | 29/827 |
| 5,118,271 A | * | 6/1992 | Baird et al. | 425/116 |
| 5,347,429 A | * | 9/1994 | Kohno et al. | 361/813 |
| 5,422,435 A | * | 6/1995 | Takiar et al. | 174/521 |
| 5,463,253 A | * | 10/1995 | Waki et al. | 257/724 |
| 5,615,089 A | * | 3/1997 | Yoneda et al. | 361/764 |
| 5,646,829 A | * | 7/1997 | Sota | 361/813 |
| 5,801,072 A | * | 9/1998 | Barber | 438/107 |
| 5,815,372 A | * | 9/1998 | Gallas | 361/760 |
| 5,981,312 A | * | 11/1999 | Farquhar et al. | 438/112 |
| 6,057,598 A | * | 5/2000 | Payne et al. | 257/723 |
| 6,117,382 A | * | 9/2000 | Thummel | 264/272.14 |
| 6,198,171 B1 | * | 3/2001 | Huang et al. | 257/787 |
| 6,319,449 B1 | | 11/2001 | Campbell et al. | |
| 6,331,453 B1 | | 12/2001 | Bolken et al. | |
| 6,332,766 B1 | * | 12/2001 | Thummel | 425/116 |
| 6,358,773 B1 | | 3/2002 | Lin et al. | |
| 6,400,007 B1 | * | 6/2002 | Wu et al. | 257/686 |
| 6,521,480 B1 | * | 2/2003 | Mitchell et al. | 438/108 |
| 6,548,766 B2 | | 4/2003 | Daido | |
| 6,560,122 B2 | | 5/2003 | Weber | |
| 6,616,880 B2 | * | 9/2003 | Thummel | 264/272.13 |
| 6,656,769 B2 | | 12/2003 | Lee et al. | |
| 6,660,558 B1 | | 12/2003 | Bolken et al. | |
| 6,667,439 B2 | * | 12/2003 | Salatino et al. | 174/565 |
| 6,717,248 B2 | * | 4/2004 | Shin et al. | 257/678 |
| 6,787,093 B2 | * | 9/2004 | Kiritani | 264/511 |
| 6,817,854 B2 | * | 11/2004 | Hundt et al. | 425/125 |
| 6,867,487 B2 | | 3/2005 | Huang et al. | |
| 7,049,166 B2 | | 5/2006 | Salatino et al. | |
| 7,147,447 B1 | * | 12/2006 | Takahashi | 425/89 |
| 7,190,067 B2 | | 3/2007 | Chen et al. | |
| 7,323,767 B2 | | 1/2008 | James et al. | |
| 7,368,391 B2 | | 5/2008 | Tan et al. | |
| 7,425,758 B2 | | 9/2008 | Corisis et al. | |
| 7,504,736 B2 | | 3/2009 | Kim et al. | |
| 2002/0084537 A1 | | 7/2002 | Cheng et al. | |
| 2006/0076695 A1 | | 4/2006 | Hsieh et al. | |

(Continued)

*Primary Examiner* — Edmund H. Lee
(74) *Attorney, Agent, or Firm* — Ishimaru & Associates LLP

(57) ABSTRACT

An integrated circuit package system that includes: providing a support structure including a device and an electrical contact adjacent thereto; providing a mold system having a cavity, a recess channel, a recess integrally connected to the recess channel, and a resilient member that cooperatively engages the recess channel and the recess; engaging the mold system and the support structure with the cavity over the device and the resilient member between the device and the electrical contact; and injecting encapsulation material into the cavity.

12 Claims, 7 Drawing Sheets

(56) References Cited

U.S. PATENT DOCUMENTS

| | | | |
|---|---|---|---|
| 2007/0262473 A1* | 11/2007 | Yim et al. ..................... 257/787 |
| 2008/0048309 A1 | 2/2008 | Corisis et al. |
| 2008/0150119 A1 | 6/2008 | Jang et al. |

* cited by examiner

INTEGRATED CIRCUIT PACKAGE SYSTEM EMPLOYING RESILIENT MEMBER MOLD SYSTEM TECHNOLOGY

CROSS-REFERENCE TO RELATED APPLICATION(S)

The present application contains subject matter related to U.S. patent application Ser. No. 11/615,919, now U.S. Pat. No. 8,252,615, assigned to STATS ChipPAC Ltd.

TECHNICAL FIELD

The present invention relates generally to integrated circuits, and more particularly to an integrated circuit package system employing resilient member mold system technology.

BACKGROUND ART

Integrated circuits are what power many of today's consumer electronics. Integrated circuits can be found in cellphones, video cameras, portable music players, computers, and even automobiles. As customer demand improves integrated circuit (IC) performance, faster, more reliable, and higher-density circuits, need to be produced. Various techniques, such as, stacked die packages and multi-chip modules (MCM), have been developed to meet the continued demands for improving system performance. Commonly, these package structures are formed with a mold configuration on the top side and/or the bottom side of a package to provide protection.

With the advent of three-dimensional packaging, these mold configurations have evolved to allow protection of an underlying package while permitting vertical integration of additional packages or devices formed thereover. As demand continues towards a higher density of integrated circuits within a package, vertical integration has necessitated the need for the protective mold configurations to be formed adjacent electrical solder ball pad sites. Some common examples of a protective mold configuration adjacent an electrical solder ball pad pattern include package-on-package and fan-in package-on-package designs.

Frequently, these packages have a very short mold to solder ball pad clearance. Consequently, the solder ball pad sites adjacent the mold are commonly invaded by mold flash. Unfortunately, mold flash can obscure the solder ball pad site, which can lead to poor of failed electrical interconnections. These electrical interconnect inconsistencies can cause unacceptable package yields and unacceptable device failures upon integration into consumer products. Needless to say, such inconsistencies can also increase production costs.

Thus, a need still remains for a reliable integrated circuit package system and method of fabrication, wherein the integrated circuit package system does not suffer from mold flash that obscures adjacent electrical patterns. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a support structure including a device and an electrical contact adjacent thereto; providing a mold system having a cavity, a recess channel, a recess integrally connected to the recess channel, and a resilient member that cooperatively engages the recess channel and the recess; engaging the mold system and the support structure with the cavity over the device and the resilient member between the device and the electrical contact; and injecting encapsulation material into the cavity.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
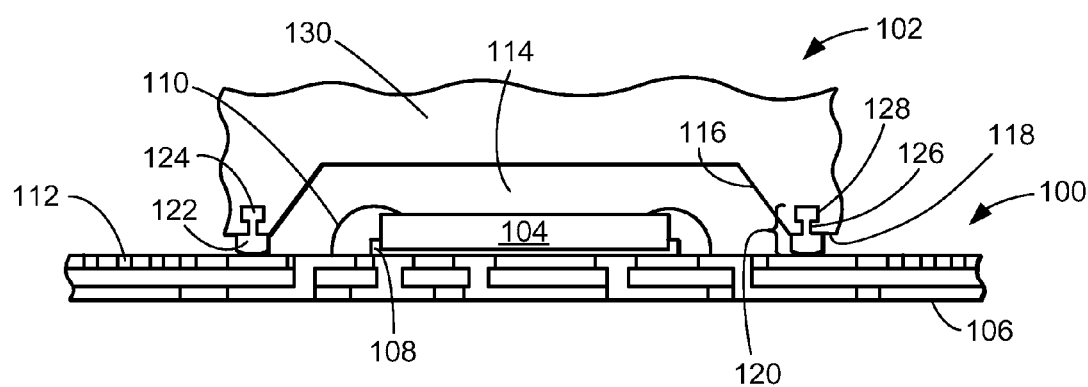
FIG. 1 is a cross-sectional view of an integrated circuit package system and a mold system, in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the support structure, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processed" or "processing" as used herein includes deposition of material or photoresist, patterning, exposure, development, etching, cleaning, and/or removal of the material or photoresist as required in forming a described structure. The term "example" is used herein to mean serving as an example, instance, or illustration. Any aspect or embodiment described herein as an "example" is not necessarily to be construed as preferred or advantageous over other aspects or designs.

Referring now to FIG. 1 therein is shown a cross-sectional view of an integrated circuit package system 100 and a mold system 102, in accordance with an embodiment of the present invention.

The integrated circuit package system 100 includes a device 104 stacked over and secured to a support structure 106. By way of example, the device 104 may include semiconductor chips and integrated circuit packages selected from active components, passive components, processor components, memory components, logic components, digital components, analog components, power components, and so forth, in numerous configurations and arrangements as may be needed. As exemplary illustrations, the device 104 may more specifically include a digital signal processor, an application specific integrated circuit, a graphical processor unit, flash memory, dynamic random access memory (DRAM), magnetic random access memory (MRAM), static random access memory (SRAM), an optical sensor device, a micro-electro-mechanical device, a radio frequency (RF) device, and/or a combination thereof.

Furthermore, it is to be understood that the device 104 may more specifically include Package-in-Package (PiP) and Package-on-Package (PoP) configurations. The PiP system is a 3D package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board mount process.

In accordance with the present invention the device 104 covers a wide range of semiconductor chip and integrated circuit package configurations involving various types, sizes, dimensions, and electrical contact techniques, and the kind of chip or package configuration employed should only be limited by the design specifications of the integrated circuit package system 100.

Notably, the present invention allows for testing of the device 104 before adhering it to the support structure 106, therefore ensuring the use of known good die or packages in the manufacturing process.

As illustrated, the support structure 106 supports only one of the device 104, but it may also support and electrically interconnect additional components or packages formed over the device 104 or beside the device 104. By way of example, the support structure 106 may include a printed wiring board, a pre-molded leadframe, circuitry tape, a flexible circuit substrate, a semiconductor substrate, or any multi-layer structure (e.g.—a laminate with one or more metal layers) suitable for electrically interconnecting integrated circuit systems (e.g.— the device 104) formed on the support structure 106 to external electrical circuits.

However, the support structure 106 is not to be limited to these examples. In accordance with the scope of the present invention, the support structure 106 may include any electrical interconnection structure that facilitates the incorporation of the integrated circuit package system 100 into a higher-level assembly, such as a printed circuit board or other suitable structure for supporting and/or electrically interfacing with the integrated circuit package system 100. By way of example, the support structure 106 may also be part of a leadframe, a tape and reel configuration, or a panel configuration, thereby allowing the processing of multiple package systems at a time. Furthermore, it is to be understood that the support structure 106 may also incorporate attributes that promote the dissipation of heat away from the integrated circuit package system 100.

The device 104 can be affixed to the support structure 106 by an inter-device structure 108. The inter-device structure 108 may include an adhesive with or without thermally conducting capabilities, a spacer, an electromagnetic interference shield for blocking potentially disruptive energy fields, or a combination thereof. For example, if the inter-device structure 108 is an adhesive layer, the adhesive layer may include a film or a partially unconsolidated (e.g.—a liquid or a gel) adhesive material, which allows the device 104 to self-align. Furthermore, if the inter-device structure 108 is an adhesive layer, the adhesive layer can be deposited in any configuration or shape, which facilitates the adhesion of the device 104, such as a zero-fillet adhesive layer.

An electrical connection 110 electrically connects the device 104 to the support structure 106. By way of example, the electrical connection 110 may include a wire bond. The electrical connection 110 can be deposited using materials and techniques well known within the art, and for a wire bond, is currently only limited by the technology of wire bond equipment and the minimum required operating space. The electrical connection 110 may include materials such as gold or aluminum, for example.

The present invention may also include an electrical contact 112 adjacent the device 104 for electrically connecting additional components and packages formed over the device 104. By way of example, the electrical contact 112 may be designed to accommodate solder ball interconnects.

The mold system 102 has been strategically engineered and designed to prevent and/or minimize the dispersion of an encapsulation material (e.g.—mold flash) between the support structure 106 and the mold system 102. The mold system 102 includes a cavity 114, a sidewall 116, a mold system bottom surface 118, a resilient member 120, a resilient member bottom portion 122, a resilient member top portion 124, a recess channel 126, a recess 128, and a mold body 130. As is evident from the disclosure herein, the mold system 102 includes a securing mechanism or means for joining/engaging the mold system 102 to the integrated circuit package system 100 and conduits for disbursement of an encapsulation material.

During formation of the integrated circuit package system 100, the mold system 102 engages the support structure 106 such that an encapsulation material can be injected within the cavity 114 to surround and protect the device 104. By way of example, the mold system 102 may include a top gate mold chase or a lateral gate mold chase. The cavity 114 and the sidewall 116 of the mold system 102 can be designed to accommodate or fit over the device 104 and the electrical connection 110. However, it is to be understood that the configuration of the cavity 114 can be designed to accommodate or fit over any structure that requires a mold encapsulation adjacent the electrical contact 112. Notably, the sidewall 116 is slanted to facilitate the release (or disengagement) of the mold system 102 from the support structure 106.

Additionally, the mold system 102 of the present invention has been designed for cooperative attachment with the support structure 106. The present invention achieves cooperative attachment between the mold system 102 and the support structure 106 by providing the resilient member 120 between the mold system bottom surface 118 and the support structure 106. After engaging the support structure 106, the resilient member 120 is positioned between the device 104 and the electrical contact 112. The design of the resilient member 120 is such that when mated together with the support structure 106, a secure contact occurs between a surface of the resilient member 120 and a surface of the support structure 106.

Per this invention, a secure contact can be defined as the amount of force applied between adjacent surfaces that prevents or minimizes mold flash due to separation of the surfaces during manufacturing operations, wherein at least one of the surfaces possesses the resilient member 120. By way of example, the secure contact of the present invention helps to ensure that an opening does not occur between the resilient member 120 and the support structure 106, thereby helping to prevent or retard the flow or flashing of an encapsulation material. By creating a secure contact between the resilient member 120 and the support structure 106, the present invention can prevent or minimize the formation of a mold flash structure that can obscure the electrical contact 112. Stated another way, the resilient member 120 can stop the flow of the encapsulation material.

The resilient member bottom portion 122 should be made from materials that can ensure a secure contact. For example, the resilient member bottom portion 122 can be made from an elastic material, such as a heat-resistant plastic (e.g.—a polyimide or fluorinated resin), a heat-resistant rubber (e.g.—a silicone rubber/elastomer), or polyetheretherketone (PEEK). By choosing a material with pliable and/or flexible characteristics, the resilient member bottom portion 122 will not only prevent or reduce the amount of mold flash during injection, but it may also help to effectively abate and/or absorb forces generated during engagement of the integrated circuit package system 100 by the mold system 102. Furthermore, it is to be understood that the degree of deformation or expansion of the resilient member 120 during engagement of the integrated circuit package system 100 by the mold system 102 will depend upon the material chosen for the resilient member bottom portion 122, as well as, the mold system 102 press force, and/or the degree of tilt of the support structure 106.

It has been discovered by the present inventors that the mold system 102 requires no additional clamping force to prevent or minimize the dispersion or flow of an encapsulation material outside of the area defined by the cavity 114. Notably, the present invention allows direct contact of the mold system 102 with the exposed active material of the support structure 106 without introducing process instability, such as damage to the active material of the support structure 106, which can lead to production yield loss.

The resilient member 120 is attached to the mold system 102 by inserting the resilient member top portion 124 into the recess channel 126 and into the recess 128. The recess channel 126 and the recess 128 can be formed adjacent the cavity 114. By way of example, the recess channel 126 may include a narrow rectangular slot that extends continuously or in an interrupted fashion around the perimeter of the cavity 114.

The recess 128 is formed integrally with the recess channel 126. The recess 128 may include a c-shaped opening, wherein the flat side of the c-shaped opening interfaces with the recess channel 126. The resilient member top portion 124 that is inserted into the recess channel 126 and the recess 128 should possess a similar design configuration and similar design dimensions as the recess channel 126 and the channel 128, thereby ensuring a tight fit. The resilient member top portion 124 should be made from a material that cooperatively engages with the recess channel 126 and the recess 128 after insertion. As an exemplary illustration, the resilient member top portion 124 may also be made from an elastic material, such as a polymer.

Per this invention, materials that cooperatively engage can be defined to include materials that do not separate from the recess channel 126 and the recess 128 during manufacturing operations. By forming the resilient member top portion 124 from materials that cooperatively engage the recess channel 126 and the recess 128, the resilient member 120 remains attached to the mold system 102 after separation from the integrated circuit package system 100 and can be reused.

The resilient member bottom portion 122 and the resilient member top portion 124 can be made from similar materials or they can be made from different materials that maximize the desired attributes for each respective portion.

Furthermore, although the recess 128 is depicted as a c-shaped configuration, it is to be understood that this configuration is merely representative and not limiting. In accordance with the scope of the present invention, the configuration of the recess 128 may include any shape or design that permits a cooperative engagement between the resilient member top portion 124 and the recess channel 126 and the recess 128.

Additionally, the materials chosen for the resilient member 120 provide further aspects. For example, the materials chosen for the resilient member 120 permit replacement of the worn out parts of the resilient member 120 easily. If the resilient member 120 needs to be replaced, the old or damaged portion of the resilient member 120 can be removed and replaced without requiring a large amount of down-time for the system. By only requiring a modification to the resilient member 120, without requiring a change to the mold system 102 in its entirety, the present inventors have discovered a time-saving retool modification step that will increase productivity output.

A further example, is the cost savings aspect afforded by the resilient member 120 because preventive maintenance replacement of the resilient member 120 is more economical than replacing the mold system 102 in its entirety.

Furthermore, an additional aspect of the present invention is its simple design. The straightforward design of the mold system 102 produces an easily manufactured system that exhibits a low failure rate due to its simplicity.

Figure 2:
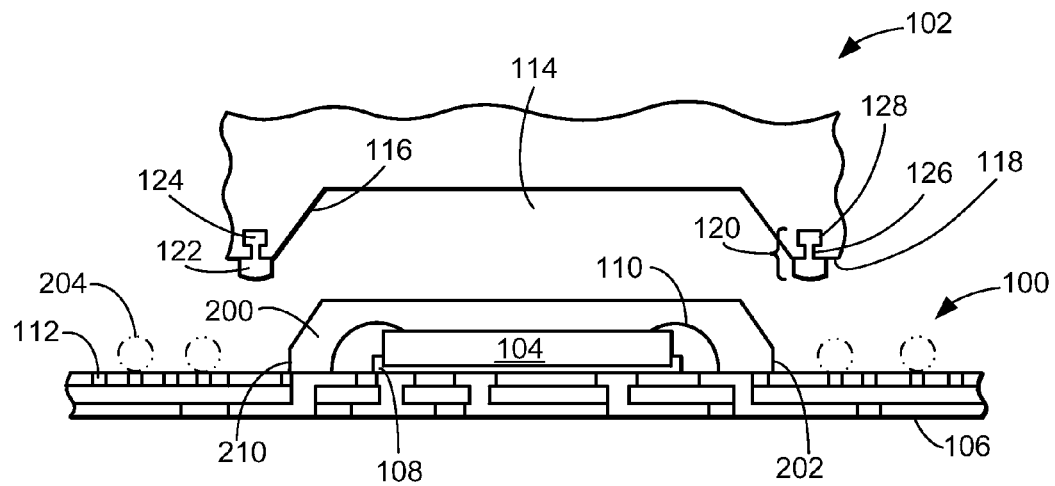
FIG. 2 is the structure of FIG. 1 after disengagement of a mold system, in accordance with an embodiment of the present invention.

Referring now to FIG. 2, therein is shown the structure of FIG. 1 after disengagement of the mold system 102, in accordance with an embodiment of the present invention. The integrated circuit package system 100 includes the device 104, the support structure 106, the inter-device structure 108, the electrical connection 110, the electrical contact 112, and an encapsulant 200. The mold system 102 includes the cavity 114, the sidewall 116, the mold system bottom surface 118, the resilient member 120, the resilient member bottom portion 122, the resilient member top portion 124, the recess channel 126, and the recess 128.

The encapsulant 200 is formed over the device 104 and the electrical connection 110. The encapsulant 200 may include an encapsulation material, such as an epoxy or a resin that is injected through the mold system 102 into the cavity 114 over the device 104. The encapsulant 200 and its purpose are well known within the art and not repeated herein.

An encapsulant rim 202 can be formed at the interface of the encapsulant 200 and the resilient member 120. The encapsulant rim 202 is a non-horizontal portion of the encapsulant 200 that is directly attached to the support structure 106. Generally, the encapsulant rim 202 can be formed in a substantially vertical manner that is substantially orthogonal to the major plane of the support structure 106. The encapsulant rim 202 is formed adjacent to an exposed portion of the support structure 106 and the encapsulant 200 extending above the level of the encapsulant rim 202. Uniquely, the encapsulant rim 202 exhibits or possesses the characteristics of being molded from the mold system 102. The characteristics of being molded from the mold system 102 may include physical features, such as a tread or imprint within the encapsulant rim 202, which are indicative of a mold process that employs the resilient member 120. As an exemplary illustration, the encapsulant rim 202 includes an impression forming a concave surface 210 formed by the resilient member 120 incorporated in the mold system 102.

Notably, after separation of the mold system 102 from the integrated circuit package system 100, the encapsulant 200 has been confined to the area of the support structure 106 defined by the cavity 114 and the resilient member 120. Stated another way, the resilient member 120 has prevented or minimized the mold flash of the encapsulant 200 from adversely affecting the electrical contact 112. The electrical contact 112 can be designed to accommodate an electrical interconnect 204, such as a solder ball shown in phantom outline, from a vertically stacked package formed thereover.

Figure 3A:
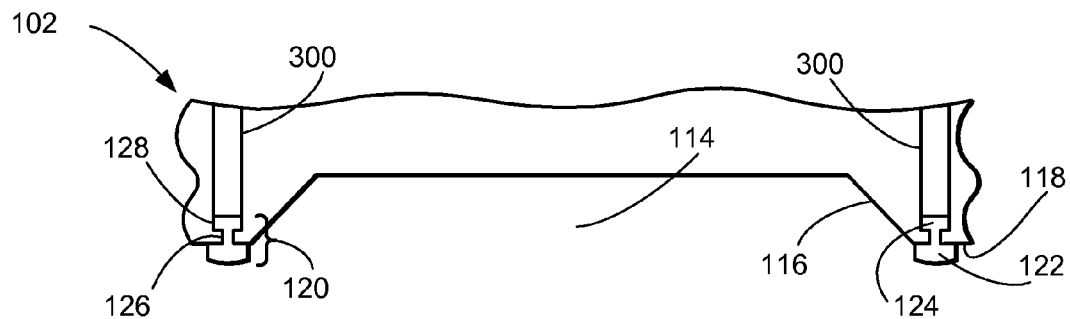
FIG. 3A is a cross sectional view of a mold system, in accordance with another embodiment of the present invention.

Referring now to FIG. 3A, therein is shown a cross sectional view of the mold system 102, in accordance with another embodiment of the present invention. The mold system 102 includes the cavity 114, the sidewall 116, the mold system bottom surface 118, the resilient member 120, the resilient member bottom portion 122, the resilient member top portion 124, the recess channel 126, the recess 128, and a vacuum channel 300. This embodiment depicts the resilient member 120 formed adjacent the sidewall 116 and the vacuum channel 300 connected to the recess 128, such that a negative pressure differential may be applied to the recess 128.

By applying a vacuum to the recess 128, the resilient member top portion 124 is further secured within the recess 128 and the recess channel 126. Additionally, the vacuum applied through the vacuum channel 300 further secures the resilient member 120 to the mold system 102 by mating the resilient member bottom portion 122 to the mold system bottom surface 118. The vacuum supplied through the vacuum channel 300 to the resilient member 120, helps to prevent the resilient member 120 from adhering to the integrated circuit package system 100, of FIG. 1, during separation of the mold system 102 from the support structure 106.

It is to be understood that the present invention may employ one or more of the vacuum channel 300 strategically positioned to promote adhesion between the mold system 102 and the resilient member 120.

Figure 3B:
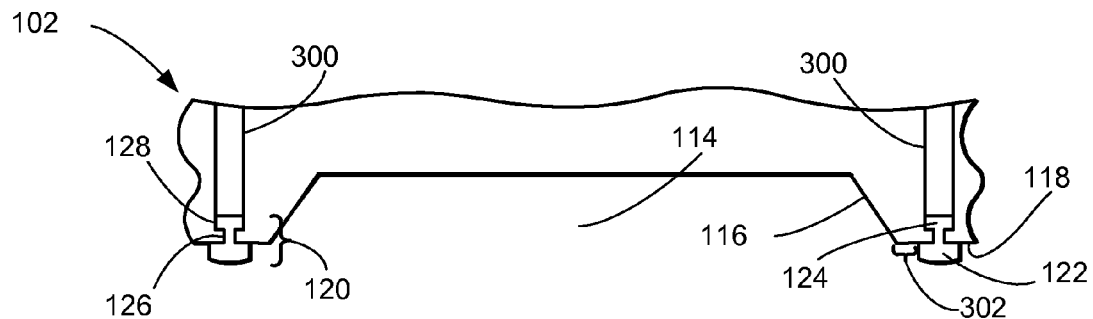
FIG. 3B is a cross sectional view of a mold system, in accordance with another embodiment of the present invention.

Referring now to FIG. 3B, therein is shown a cross sectional view of the mold system 102, in accordance with another embodiment of the present invention. FIG. 3B depicts a similar configuration as to that shown in FIG. 3A, and consequently, only the differences between the figures will be described, to avoid redundancy. The mold system 102 includes the cavity 114, the sidewall 116, the mold system bottom surface 118, the resilient member 120, the resilient member bottom portion 122, the resilient member top portion 124, the recess channel 126, the recess 128, and a vacuum channel 300. This embodiment depicts the resilient member 120 offset from the sidewall 116 by an offset distance 302 and the vacuum channel 300 connected to the recess 128, such that a negative pressure differential may be applied to the recess 128. In accordance with the scope of the present invention, the offset distance 302 may equal any distance that prevents and/or minimizes mold flash between the mold system 102 and the integrated circuit package system 100, of FIG. 1.

FIGS. 4A-9 will refer to two different embodiments that can be applied to FIGS. 1-3B. More specifically, FIGS. 4A-6 will refer to embodiment one, as applied to FIGS. 1-3B, and FIGS. 7-9 will refer to embodiment two, as applied to FIGS. 1-3B.

Embodiment One

Figure 4A:
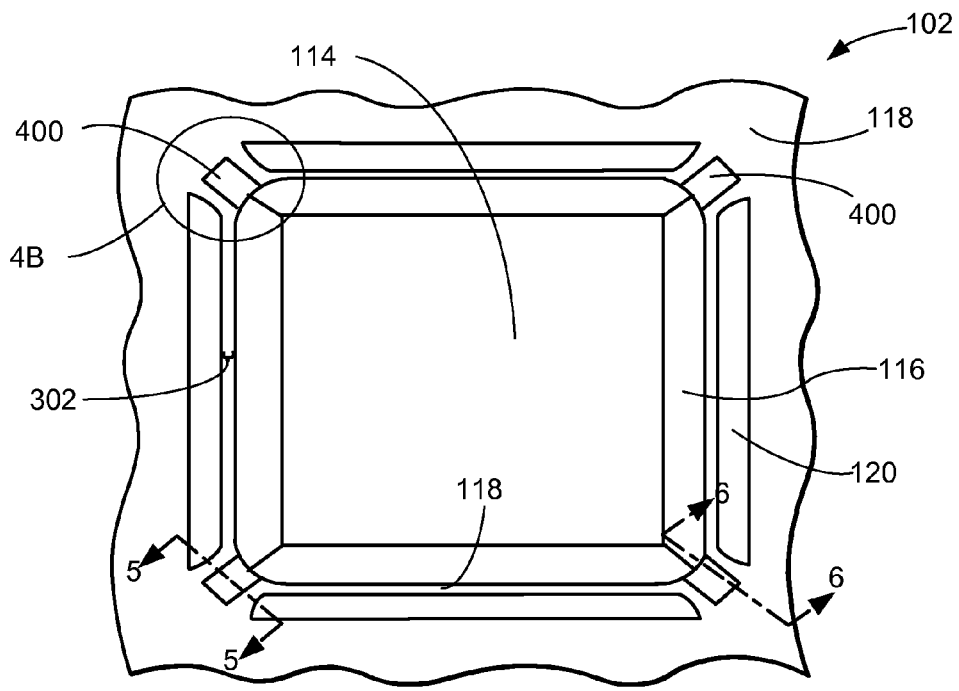
FIG. 4A is a bottom view of a mold system, in accordance with an embodiment of the present invention.

Referring now to FIG. 4A, therein is shown a bottom view of the mold system 102, in accordance with an embodiment of the present invention. This view depicts the cavity 114, the sidewall 116, the mold system bottom surface 118, the resilient member 120, the offset distance 302, and a groove 400. Although, the present embodiment depicts the mold system 102 including the offset distance 302, it is to be understood that the mold system 102 need not include the offset distance 302.

Per this embodiment, the resilient member 120 traverses the perimeter of the cavity 114 and is interrupted by the groove 400, which is formed within the mold body 130, of FIG. 1. The resilient member 120 prevents and/or minimizes mold flash between the mold system 102 and the integrated circuit package system 100, of FIG. 1, while the groove 400 provides an air vent for gases displaced by the injection of the encapsulation material. Although the groove 400 is depicted as square in shape, the groove 400 may include any design or shape. In accordance with the scope of the present invention, it is to be understood that the design or shape of the groove 400 is not essential, what is important is that the groove 400 include a hollow space in which gases may accumulate.

Furthermore, although the present embodiment depicts four of the groove 400, it is to be understood that the present invention may include a design with one or more of the groove 400 strategically located around the cavity 114 to maximize air venting. It is to be understood that the invention includes any configuration or design of the groove 400 that provides an air vent for gases displaced by the injection of the encapsulation material.

The present inventors have also discovered that the groove 400 can act as a collection reservoir for excess encapsulation material. Accordingly, the groove 400 helps to prevent mold flash by absorbing and/or collecting excess encapsulation material that may obscure the electrical contact 112, of FIG. 1, and thereby improves product yield by preventing device failure due to failed or weakened electrical interconnects.

Additionally, the present inventors have discovered that pressure within the groove 400 may help to prevent and/or retard the dispersion of the encapsulation material within the groove 400. The pressure within the groove 400 may occur from gases displaced by the injection of the encapsulation material or it may be artificially created by an external pressure control system connected to the groove 400 by conduits (not shown). However, these examples are not to be construed as limiting. In accordance with the scope of the present invention, the mold system 102 and the groove 400 may include any system or method that helps to prevent and/or retard dispersion of the encapsulation material between the mold system 102 and the integrated circuit package system 100 by pressure differentiation.

Figure 4B:
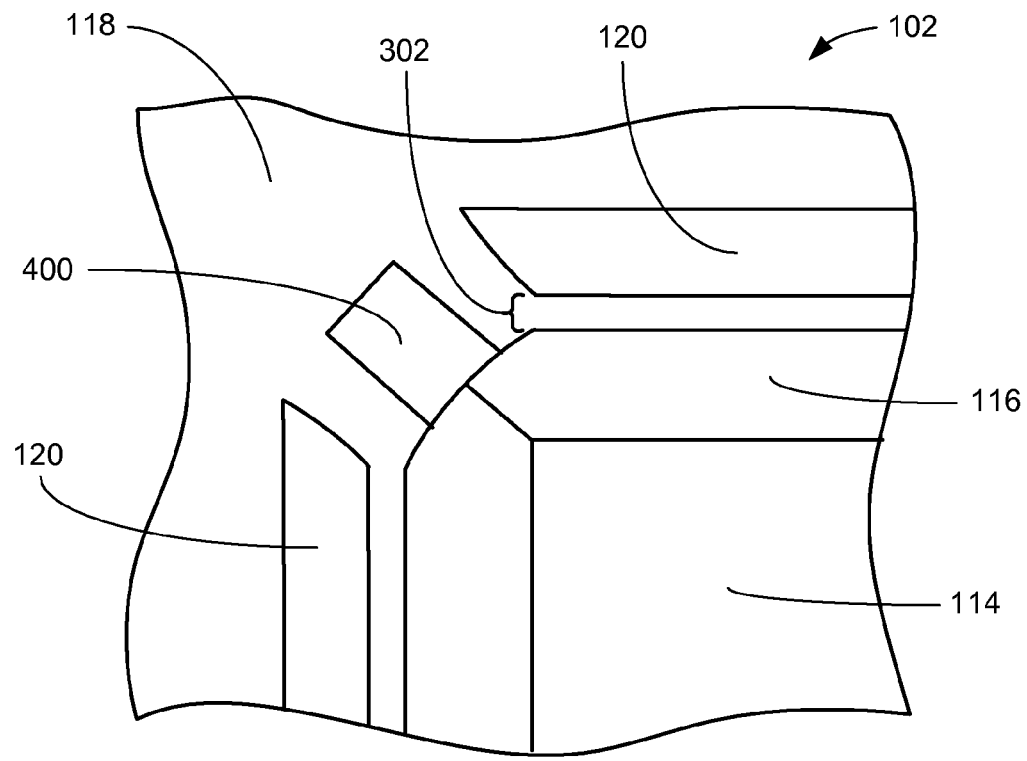
FIG. 4B is an enlarged view of a circle 4B of FIG. 4A, in accordance with an embodiment of the present invention.

For purposes of clarity, a circle 4B denotes a portion of the mold system 102 depicted by an enlarged view in FIG. 4B.

Referring now to FIG. 4B, therein is shown an enlarged view of the circle 4B, of FIG. 4A, in accordance with an embodiment of the present invention. This view depicts a portion of the mold system 102 including the cavity 114, the sidewall 116, the mold system bottom surface 118, the resilient member 120, the offset distance 302, and the groove 400.

Figure 5:
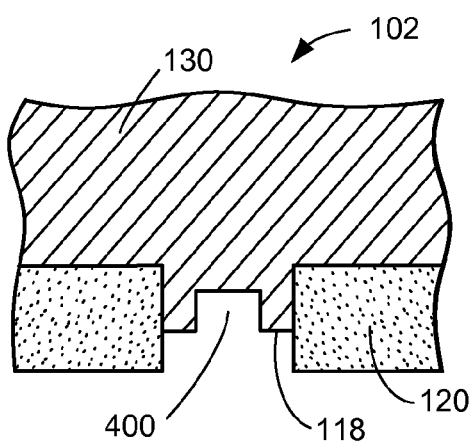
FIG. 5 is a cross sectional view of the structure of FIG. 4A taken on line 5-5, in accordance with an embodiment of the present invention.

Referring now to FIG. 5, therein is shown a cross sectional view of the structure of FIG. 4A taken on line 5-5, in accordance with an embodiment of the present invention. This view depicts a portion of the mold system 102 including the mold system bottom surface 118, the resilient member 120 and the groove 400. As can be seen, this illustration depicts the groove 400 as a hollow space, which can be used as an air vent, for example. Notably, the groove 400 is formed as part of the mold body 130.

Figure 6:
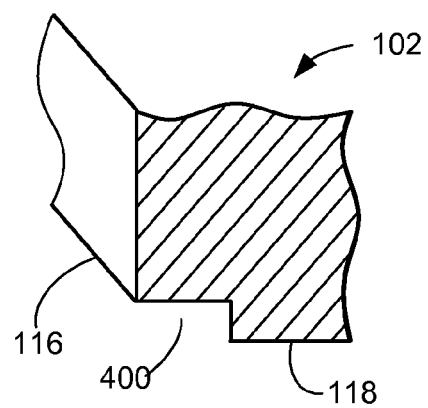
FIG. 6 is a cross sectional view of the structure of FIG. 4A taken on line 6-6, in accordance with an embodiment of the present invention.

Referring now to FIG. 6, therein is shown a cross sectional view of the structure of FIG. 4A taken on line 6-6, in accordance with an embodiment of the present invention. This view depicts a portion of the mold system 102 including the sidewall 116, the mold system bottom surface 118, and the groove 400. Per this illustration, it can be seen that the groove 400 is integrally connected with the cavity 114, of FIGS. 1 and 4A, thereby providing a hollow space for accumulating gases displaced by the injection of an encapsulation material.

Embodiment Two

Figure 7:
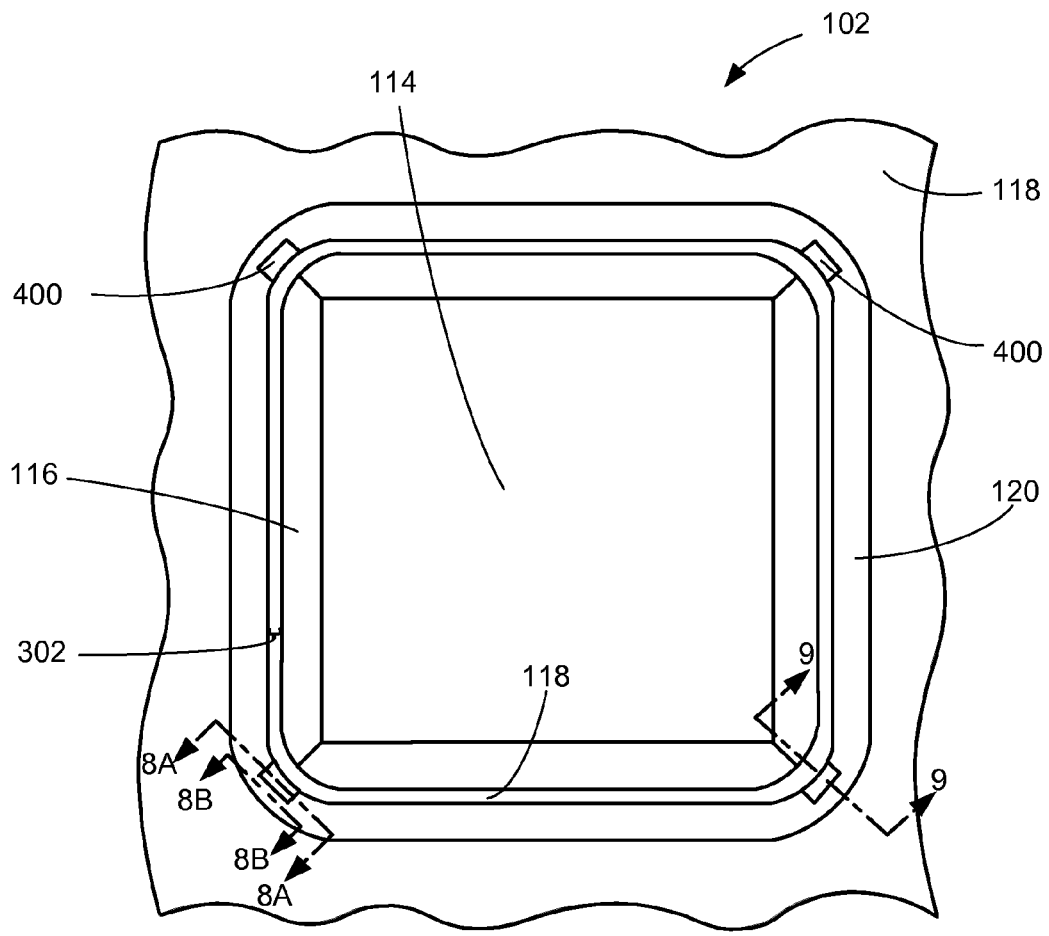
FIG. 7 is a bottom view of a mold system, in accordance with another embodiment of the present invention.

Referring now to FIG. 7, therein is shown a bottom view of the mold system 102, in accordance with another embodiment of the present invention. This view depicts the cavity 114, the sidewall 116, the mold system bottom surface 118, the resilient member 120, the offset distance 302, and the groove 400. Although, the present embodiment depicts the mold system 102 including the offset distance 302, it is to be understood that the mold system 102 need not include the offset distance 302.

Per this embodiment, the resilient member 120 traverses the perimeter of the cavity 114 uninterrupted/continuously and the groove 400 is formed within the resilient member 120. The resilient member 120 prevents and/or minimizes mold flash between the mold system 102 and the integrated circuit package system 100, of FIG. 1, while the groove 400 provides an air vent for gases displaced by the injection of the encapsulation material. Although the groove 400 is depicted as square in shape, the groove 400 may include any design or shape. In accordance with the scope of the present invention, it is to be understood that the design or shape of the groove 400 is not essential, what is important is that the groove 400 include a hollow space in which gases may accumulate.

Furthermore, although the present embodiment depicts four of the groove 400, it is to be understood that the present invention may include a design with one or more of the groove 400 strategically located around the cavity 114 to maximize air venting. It is to be understood that the invention includes any configuration or design of the groove 400 that provides an air vent for gases displaced by the injection of the encapsulation material.

The present inventors have also discovered that the groove 400 can act as a collection reservoir for excess encapsulation material. Accordingly, the groove 400 helps to prevent mold flash by absorbing and/or collecting excess encapsulation material that may obscure the electrical contact 112, of FIG. 1, and thereby improves product yield by preventing device failure due to failed or weakened electrical interconnects.

Additionally, the present inventors have discovered that pressure within the groove 400 may help to prevent and/or retard the dispersion of the encapsulation material within the groove 400. The pressure within the groove 400 may occur from gases displaced by the injection of the encapsulation material or it may be artificially created by an external pressure control system connected to the groove 400 by conduits (not shown). However, these examples are not to be construed as limiting. In accordance with the scope of the present invention, the mold system 102 and the groove 400 may include any system or method that helps to prevent and/or retard dispersion of the encapsulation material by pressure differentiation.

Figure 8A:
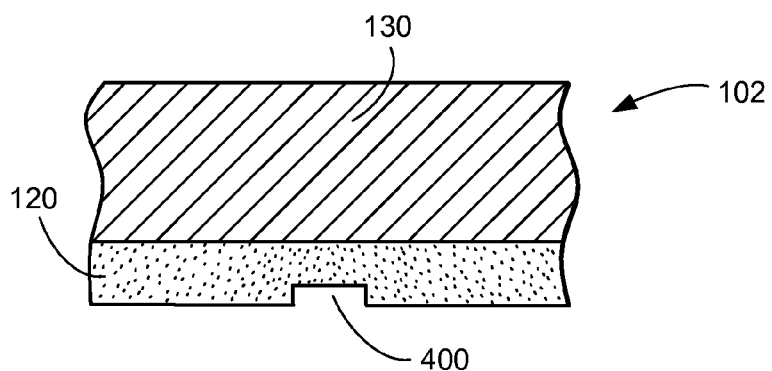
FIG. 8A is a cross sectional view of the structure of FIG. 7 taken on line 8A-8A, in accordance with an embodiment of the present invention.

Referring now to FIG. 8A, therein is shown a cross sectional view of the structure of FIG. 7 taken on line 8A-8A, in accordance with an embodiment of the present invention. This view depicts a portion of the mold system 102 including the resilient member 120, the mold body 130, and the groove 400. As can be seen, this illustration depicts the groove 400 as a hollow space, which can be used as an air vent.

Figure 8B:
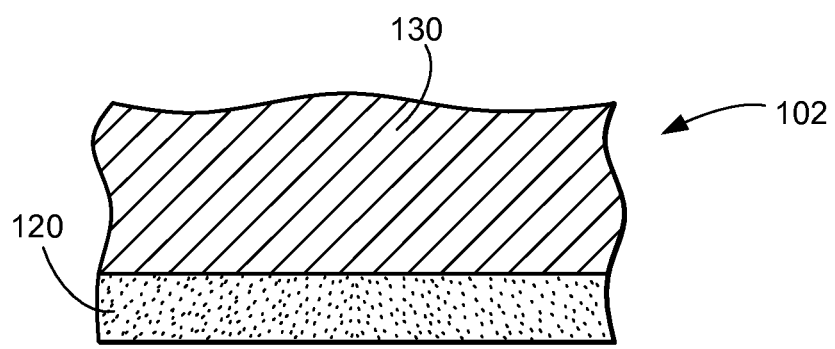
FIG. 8B is a cross sectional view of the structure of FIG. 7 taken on line 8B-8B, in accordance with an embodiment of the present invention.

Referring now to FIG. 8B, therein is shown a cross sectional view of the structure of FIG. 7 taken on line 8B-8B, in accordance with an embodiment of the present invention. This view depicts a portion of the mold system 102 including the resilient member 120 and the mold body 130. This cross sectional view depicts how the groove 400, of FIG. 7, is only formed part way through the resilient member 120.

Figure 9:
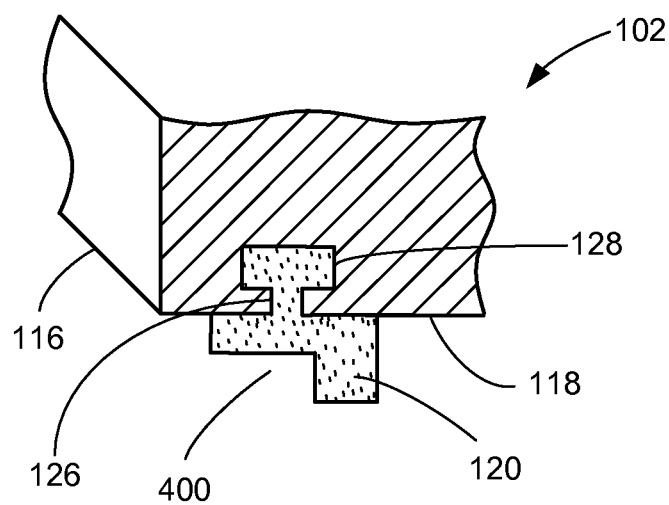
FIG. 9 is a cross sectional view of the structure of FIG. 7 taken on line 9-9, in accordance with an embodiment of the present invention.

Referring now to FIG. 9, therein is shown a cross sectional view of the structure of FIG. 7 taken on line 9-9, in accordance with an embodiment of the present invention. This view depicts a portion of the mold system 102 including the sidewall 116, the mold system bottom surface 118, the resilient member 120, the recess channel 126, the recess 128, and the groove 400. Per this illustration, it can be seen that the groove 400 is connected with the cavity 114, of FIG. 7, thereby providing a hollow space for accumulating gases displaced by the injection of an encapsulation material.

Figure 10:
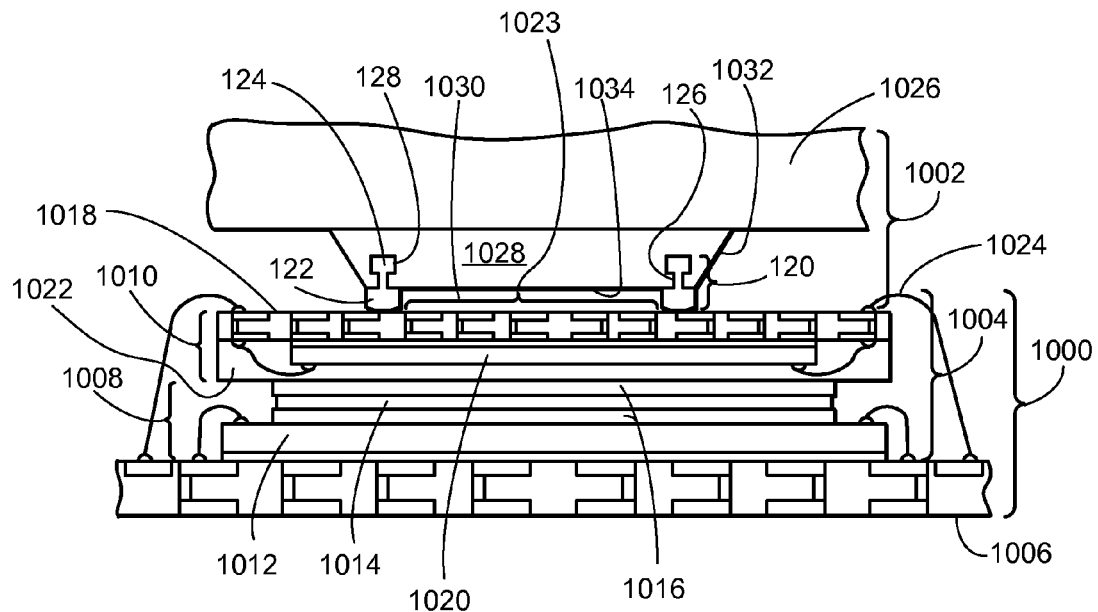
FIG. 10 is a cross sectional view of an integrated circuit package system and a mold system, in accordance with an embodiment of the present invention.
Figure 11:
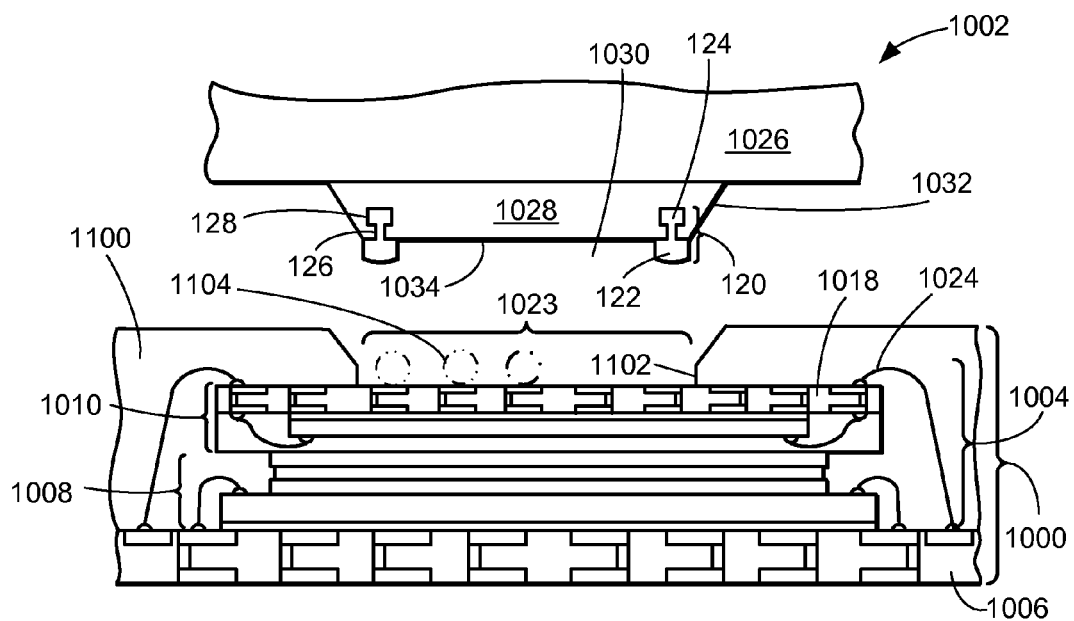
FIG. 11 is the structure of FIG. 10 after disengagement of a mold system, in accordance with an embodiment of the present invention.
Figure 12:
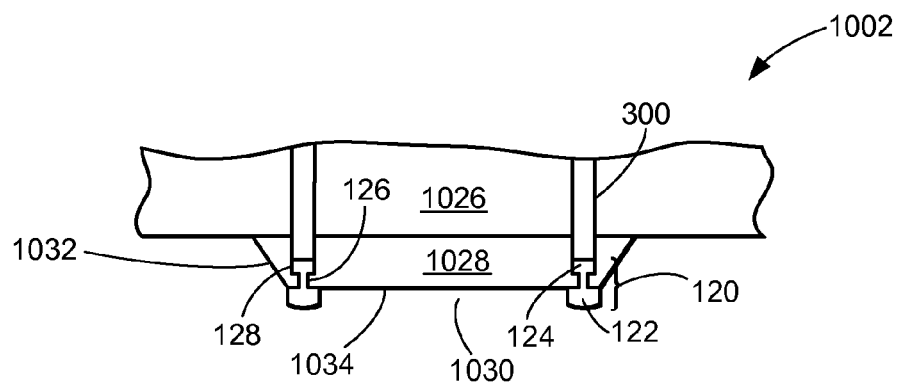
FIG. 12 is a cross sectional view of a mold system, in accordance with another embodiment of the present invention.

Referring now to FIGS. 10 through 12. FIGS. 10 through 12 refer to a third embodiment of the present invention that generally applies to three dimensional packaging, such as PiP and PoP, for example.

Embodiment Three

FIG. 10 depicts a cross sectional view of an integrated circuit package system 1000 and a mold system 1002, in accordance with an embodiment of the present invention. The integrated circuit package system 1000 may include a device 1004 formed over a support structure 1006. The device 1004 may further include a first package 1008 and a second package 1010, for example. However, it is to be understood that the device 1004 may include any number of package or packages (i.e.—one or more) as required by the design specifications of the integrated circuit package system 1000.

As an exemplary illustration, the integrated circuit package system 1000 may generally be used within a portable electronics device that requires a high level of functional integration, such as a cellphone or computer. Furthermore, by way of example, the integrated circuit package system 1000 may be referred to as a fan-in package-on-package structure.

The support structure 1006 may include a printed wiring board, a pre-molded leadframe, circuitry tape, a flexible circuit substrate, a semiconductor substrate, or any multi-layer structure (e.g.—a laminate with one or more metal layers) suitable for electrically interconnecting integrated circuit systems (e.g.—the device 1004) formed on the support structure 1006 to external electrical circuits.

However, the support structure 1006 is not to be limited to these examples. In accordance with the scope of the present invention, the support structure 1006 may include any electrical interconnection structure that facilitates the incorporation of the integrated circuit package system 1000 into a higher-level assembly, such as a printed circuit board or other suitable structure for supporting and/or electrically interfacing with the integrated circuit package system 1000. By way of example, the support structure 1006 may also be part of a leadframe, a tape and reel configuration, or a panel configuration, thereby allowing the processing of multiple systems at a time. Furthermore, it is to be understood that the support structure 1006 may also incorporate attributes that promote the dissipation of heat away from the integrated circuit package system 1000.

The first package 1008 may include a first die 1012, a second die 1014, and an intra-device structure 1016. The first die 1012 and the second die 1014 may include semiconductor chips selected from active components, passive components, processor components, memory components, logic components, digital components, analog components, power components, dummy components, and so forth, in numerous configurations and arrangements as may be needed. As exemplary illustrations, the first die 1012 and the second die 1014 may more specifically include a digital signal processor, an application specific integrated circuit, a graphical processor unit, flash memory, dynamic random access memory (DRAM), magnetic random access memory (MRAM), static random access memory (SRAM), an optical sensor device, a micro-electro-mechanical device, a radio frequency (RF) device, a spacer, and/or a combination thereof.

It is to be understood that the design of the first package 1008 covers a wide range of semiconductor chip configurations for the first die 1012 and the second die 1014, which may involve various chip sizes, chip dimensions, and the number of chips stacked; and, the type of chip configuration employed should only be limited by the design specifications of the integrated circuit package system 1000. For example, the number of chips or die stacked within the first package 1008 may include one or more and need only be limited by the required design profile thickness of the integrated circuit package system 1000.

The intra-device structure 1016 may include an adhesive with or without thermally conducting capabilities, a spacer, an electromagnetic interference shield for blocking potentially disruptive energy fields, or a combination thereof. For example, if the intra-device structure 1016 is an adhesive layer, the adhesive layer may include a film or a partially unconsolidated (e.g.—a liquid or a gel) adhesive material, which allows the first die 1012 and the second die 1014 to self-align. Furthermore, if the intra-device structure 1016 is an adhesive layer, the adhesive layer can be deposited in any configuration or shape, which facilitates the adhesion of the first die 1012 and the second die 1014, such as a zero-fillet adhesive layer.

The second package 1010 may include the intra-device structure 1016, a substrate 1018, a die 1020, and a mold 1022. By way of example, the second package 1010 may include an inverted package design, such as an inverted chip scale package or an inverted internal stacking module device, mounted over the first package 1008.

The die 1020 may include semiconductor chips selected from active components, passive components, processor components, logic components, digital components, analog components, memory components, power components, and so forth, in numerous configurations and arrangements as may be needed. As an exemplary illustration, the die 1020 may more specifically include a digital signal processor, an application specific integrated circuit, a graphical processor unit, flash memory, DRAM, MRAM, SRAM, an optical sensor device, a micro-electro-mechanical device, an RF device, and/or a combination thereof.

It is to be understood that the design of the second package 1010 covers a wide range of semiconductor chip configurations, which may involve various chip sizes, chip dimensions, and the number of chips (e.g.—a chip stack configuration of logic and memory devices); and, the type of chip configuration employed should only be limited by the design specifications of the integrated circuit package system 1000. For example, the number of chips or the die 1020 within the second package 1010 may include one or more (e.g.—in a stacked configuration) and need only be limited by the required design profile thickness of the integrated circuit package system 1000.

Notably, the present invention allows for testing of the first package 1008 and the second package 1010 before adhering it to the support structure 1006, therefore ensuring the use of known good die or packages in the manufacturing process.

The substrate 1018 may include may include a printed wiring board, a semiconductor substrate, a leadframe, or any multi-layer structure (e.g.—a laminate with one or more metal layers) suitable for electrically interconnecting additional integrated circuit systems formed thereover. However, the substrate 1018 is not to be limited to these examples. In accordance with the scope of the present invention, the substrate 1018 may include any electrical interconnection structure that facilitates the incorporation of additional integrated circuit systems formed over the substrate 1018.

Notably, the substrate 1018 includes an electrical interconnect array 1023. The electrical interconnect array 1023, such as a land grid array, can be substantially centrally located on the exposed surface of the substrate 1018. The electrical interconnect array 1023 is defined by the mold system 1002 and an encapsulation material, which forms an opening around the electrical interconnect array 1023 while protecting an electrical connection 1024 formed along the periphery of the first package 1008 and the second package 1010. The electrical interconnect array 1023 can be used to electrically interconnect additional components and packages formed over the substrate 1018. By way of example, the electrical interconnect array 1023 may be designed to accommodate solder ball interconnects.

The electrical connection 1024 electrically connects the first package 1008 and the second package 1010 to the support structure 1006. By way of example, the electrical connection 1024 may include a wire bond. The electrical connection 1024 can be deposited using materials and techniques well known within the art, and for a wire bond, is currently only limited by the technology of wire bond equipment and the minimum required operating space. The electrical connection 1024 may include materials such as gold or aluminum, for example.

The mold system 1002 has been strategically engineered and designed to prevent and/or minimize the dispersion of an encapsulation material (e.g.—mold flash) between the substrate 1018 and the mold system 1002. The mold system 1002 includes the resilient member 120, the resilient member bottom portion 122, the resilient member top portion 124, the recess channel 126, the recess 128, a body 1026, a projection 1028, a cavity 1030, a sidewall 1032, and a mold system bottom surface 1034. As is evident from the disclosure herein, the mold system 1002 includes a securing mechanism or means for joining/engaging the mold system 1002 to the integrated circuit package system 1000 and conduits for disbursement of an encapsulation material.

During formation of the integrated circuit package system 1000, the mold system 1002 engages the support structure 1006 such that an encapsulation material can be deposited around the cavity 1030 to surround and protect the device 1004. The cavity 1030 of the mold system 1002 can be designed to accommodate or fit over the electrical interconnect array 1023. However, it is to be understood that the configuration of the cavity 1030 can be designed to accommodate or fit over any electrical contact structure that requires a mold encapsulation adjacent to it. Notably, the sidewall 1032, of the projection 1028, is slanted to facilitate the release (or disengagement) of the mold system 1002 from the support structure 1006.

Additionally, the mold system 1002 of the present invention has been designed for cooperative attachment with the substrate 1018. The present invention achieves cooperative attachment between the mold system 1002 and the substrate 1018 by providing the resilient member 120 between the mold system bottom surface 1034 and the substrate 1018. The design of the resilient member 120 is such that when mated together with the substrate 1018, a secure contact occurs between a surface of the resilient member 120 and a surface of the substrate 1018.

Per this invention, a secure contact can be defined as the amount of force applied between adjacent surfaces that prevents or minimizes mold flash due to separation of the surfaces during manufacturing operations, wherein at least one of the surfaces possesses the resilient member 120. By way of example, the secure contact of the present invention helps to ensure that an opening does not occur between the resilient member 120 and the substrate 1018, thereby helping to prevent or retard the flow or flashing of an encapsulation material. By creating a secure contact between the resilient member 120 and the substrate 1018, the present invention can prevent or minimize the formation of a mold flash structure that can obscure the electrical interconnect array 1023. Stated another way, the resilient member 120 can stop the flow of the encapsulation material.

The resilient member bottom portion 122 should be made from materials that can ensure a secure contact. For example, the resilient member bottom portion 122 can be made from an elastic material, such as a heat-resistant plastic (e.g.—a polyimide or fluorinated resin), a heat-resistant rubber (e.g.—a silicone rubber/elastomer), or PEEK. By choosing a material with pliable and/or flexible characteristics, the resilient member bottom portion 122 will not only prevent or reduce the amount of mold flash during deposition, but it may also help to effectively abate and/or absorb forces generated during engagement of the integrated circuit package system 1000 by the mold system 1002. Furthermore, it is to be understood that the degree of deformation or expansion of the resilient member 120 during engagement of the integrated circuit package system 100 by the mold system 102 will depend upon the material chosen for the resilient member bottom portion 122, as well as, the mold system 102 press force, and/or the degree of tilt of the support structure 106.

It has been discovered by the present inventors that the mold system 1002 requires no additional clamping force to prevent or minimize the dispersion or flow of an encapsulation material into the area defined by the cavity 1030. Notably, the present invention allows direct contact of the mold system 1002 with an exposed surface of the substrate 1018 without introducing process instability, such as damage to the exposed surface of the substrate 1018, which can lead to production yield loss.

Furthermore, it has been discovered by the present inventors that the mold system 1002 can compensate for coplanar errors that arise due to tilting of the first package 1008 and/or the second package 1010. For example, if the first package 1008 includes multiple stacked components, planarity issues may arise between adjacent components due to variances within the production process. Consequently, when the second package 1010 is formed over the first package 1008, the second package 1010 may not be coplanar with the support structure 1006. The present invention is able to compensate for these planarity issues by employing the resilient member 120, which can adjust to uneven surfaces and still provide a secure contact.

The resilient member 120 is attached to the mold system 1002 by inserting the resilient member top portion 124 into the recess channel 126 and into the recess 128. The recess channel 126 and the recess 128 can be formed adjacent the cavity 1030 and/or along the perimeter of the cavity 1030. The recess channel 126 may include a narrow rectangular slot formed integrally with the recess 128 that extends continuously around the perimeter of the cavity 1030.

The recess 128 is formed integrally with the recess channel 126. The recess 128 may include a c-shaped opening, wherein the flat side of the c-shaped opening interfaces with the recess channel 126. The resilient member top portion 124 that is inserted into the recess channel 126 and the recess 128 should possess a similar design configuration and similar design dimensions as the recess channel 126 and the recess 128, thereby ensuring a tight fit. The resilient member top portion 124 should be made from a material that cooperatively engages with the recess channel 126 and the recess 128 after insertion. As an exemplary illustration, the resilient member top portion 124 may also be made from an elastic material, such as a polymer.

Per this invention, materials that cooperatively engage can be defined to include materials that do not separate from the recess channel 126 and the recess 128 during manufacturing operations. By forming the resilient member top portion 124 from materials that cooperatively engage the recess channel 126 and the recess 128, the resilient member 120 remains attached to the mold system 1002 after separation from the integrated circuit package system 1000 and can be reused.

The resilient member bottom portion 122 and the resilient member top portion 124 can be made from similar materials or they can be made from different materials that maximize the desired attributes for each respective portion.

Furthermore, although the recess 128 is depicted as a c-shaped configuration, it is to be understood that this configuration is merely representative and not limiting. In accordance with the scope of the present invention, the configuration of the recess 128 may include any shape or design that permits a cooperative engagement between the resilient member top portion 124 and the recess channel 126 and the recess 128.

Additionally, the materials chosen for the resilient member 120 provide further aspects. For example, the materials chosen for the resilient member 120 permit replacement of the worn out parts of the resilient member 120 easily. If the resilient member 120 needs to be replaced, the old or damaged portion of the resilient member 120 can be removed and replaced without requiring a large amount of down-time for the system. By only requiring a modification to the resilient member 120, without requiring a change to the mold system 1002 in its entirety, the present inventors have discovered a time-saving retool modification step that will increase productivity output.

A further example, is the cost savings aspect afforded by the resilient member 120 because preventive maintenance replacement of the resilient member 120 is more economical than replacing the mold system 1002 in its entirety.

Furthermore, an additional aspect of the present invention is its simple design. The straightforward design of the mold system 1002 produces an easily manufactured system that exhibits a low failure rate due to its simplicity.

Referring now to FIG. 11, therein is shown the structure of FIG. 10 after disengagement of the mold system 1002, in accordance with an embodiment of the present invention. The integrated circuit package system 1000 includes the device 1004, the support structure 1006, the first package 1008, the second package 1010, the substrate 1018, the electrical interconnect array 1023, the electrical connection 1024, and an encapsulant 1100. The mold system 1002 includes the resilient member 120, the resilient member bottom portion 122, the resilient member top portion 124, the recess channel 126, the recess 128, the body 1026, the projection 1028, the cavity 1030, the sidewall 1032, and the mold system bottom surface 1034.

The encapsulant 1100 is formed over the device 1004 and the electrical connection 1024. The encapsulant 1100 may include an encapsulation material, such as an epoxy or a resin that is deposited around the cavity 1030 of the mold system 1002. The encapsulant 1100 and its purpose are well known within the art and not repeated herein.

An encapsulant rim 1102 can be formed at the interface of the encapsulant 1100 and the resilient member 120. Uniquely, the encapsulant rim 1102 exhibits or possesses the characteristics of being molded from the mold system 1002. The characteristics of being molded from the mold system 1002 may include physical features, such as a tread or imprint within the encapsulant rim 1102, which are indicative of a mold process that employs the resilient member 120. As an exemplary illustration, the resilient member 120 may form an impression within the encapsulant rim 1102.

Notably, after separation of the mold system 1002 from the integrated circuit package system 1000, the encapsulant 1100 has been confined to an area of the substrate 1018 outside of the area defined by the cavity 1030 and the resilient member 120. Stated another way, the resilient member 120 has prevented or minimized the mold flash of the encapsulant 1100 from adversely affecting the electrical interconnect array 1023. The electrical interconnect array 1023 can be designed to accommodate an electrical interconnect 1104, such as a solder ball shown in phantom outline, from a vertically stacked package formed thereover.

Referring now to FIG. 12, therein is shown a cross sectional view of the mold system 1002, in accordance with another embodiment of the present invention. The mold system 1002 includes the resilient member 120, the resilient member bottom portion 122, the resilient member top portion 124, the recess channel 126, the recess 128, the vacuum channel 300, the body 1026, the projection 1028, the cavity 1030, the sidewall 1032, and the mold system bottom surface 1034. This embodiment depicts the vacuum channel 300 connected to the recess 128, such that a negative pressure differential may be applied to the recess 128.

By applying a vacuum to the recess 128, the resilient member top portion 124 is further secured within the recess 128 and the recess channel 126. Additionally, the vacuum applied through the vacuum channel 300 further secures the resilient member 120 to the mold system 1002 by mating the resilient member bottom portion 122 to the mold system bottom surface 1034. The vacuum supplied through the vacuum channel 300 to the resilient member 120, helps to prevent the resilient member 120 from adhering to the integrated circuit package system 1000, of FIG. 10, during separation of the mold system 1002 from the substrate 1018.

It is to be understood that the present invention may employ one or more of the vacuum channel 300 strategically positioned to promote adhesion between the mold system 1002 and the resilient member 120.

Figure 13:
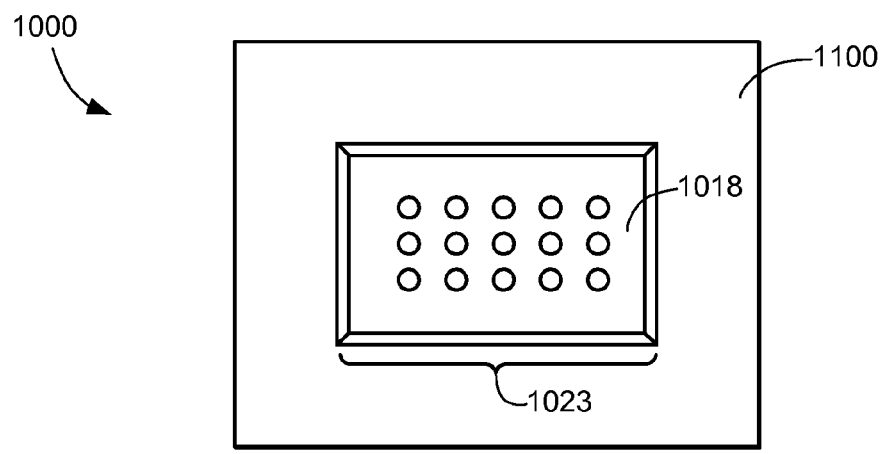
FIG. 13 is a top view of an integrated circuit package system, in accordance with an embodiment of the present invention.

Referring now to FIG. 13, therein is shown a top view of the integrated circuit package system 1000, in accordance with an embodiment of the present invention. This view depicts the encapsulant 1100 surrounding the electrical interconnect array 1023. The electrical interconnect array 1023, such as a land grid array, can be substantially centrally located on an exposed surface of the substrate 1018 that is defined by the encapsulant 1100. As an exemplary illustration, the electrical interconnect array 1023 may include a 3×5 array of electrical interconnects. However, it is to be understood that the design, size and number of the electrical interconnect array 1023 is not critical, what is important is that the electrical interconnect array 1023 provides an electrical interface between the second package 1010, of FIG. 10, and a package or system formed thereover.

Notably, the configuration of the electrical interconnect array 1023 enables free device stacking (e.g.—stacking of additional packages) with a center ball array. Conventionally, package over package stacking has been limited to peripherally located electrical contacts because the semiconductor chip has occupied the center portion of the semiconductor substrate. It has been discovered by the present inventors that by inverting a package structure, such as the second package 1010, that the electrical interconnect array 1023 contact design can be employed, which provides significant flexibility in selecting the package to be stacked, and, therefore in the kinds of functions that can be integrated. Furthermore, the electrical interconnect array 1023 can provide a very fine pitch between electrical contacts because the solder ball height and its corresponding diameter increase need not account for the height of the semiconductor chip that conventionally occupies the center portion of the semiconductor substrate.

Figure 14:
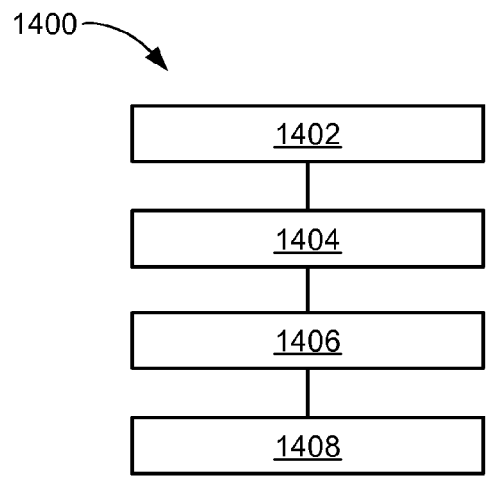
FIG. 14 is a flow chart of an integrated circuit package system for the integrated circuit package system, in accordance with an embodiment of the present invention.

Referring now to FIG. 14, therein is shown a flow chart of an integrated circuit package system 1400 for the integrated circuit package system 100 in accordance with an embodiment of the present invention. The integrated circuit package system 1400 includes providing a support structure including a device and an electrical contact adjacent thereto in a block 1402; providing a mold system having a cavity, a recess channel, a recess integrally connected to the recess channel, and a resilient member that cooperatively engages the recess channel and the recess in a block 1404; engaging the mold system and the support structure with the cavity over the device and the resilient member between the device and the electrical contact in a block 1406; and injecting encapsulation material into the cavity in a block 1408.

It has been discovered that the present invention thus has numerous aspects. One such aspect is that the present invention prevents mold flash from obscuring electrical contacts by engaging a support structure or a substrate with a resilient member formed on the bottom surface of a mold system.

Another aspect is that the present invention requires no additional clamping force to ensure a secure contact between adjacent surfaces. By providing a mold system with the resilient member, the present invention is able to engage a surface of a support structure or substrate without causing damage, thereby improving production yield.

Another aspect is that the present invention allows replacement of the resilient member, which is a low cost part that can be easily removed and replaced, instead of requiring replacement of the entire mold system. By allowing replacement of the resilient member, the present invention minimizes down time of the tool and the cost of replacement.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for preventing mold flash that can obscure electrical patterns. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   a support structure;
   a device mounted on the support structure; and
   an encapsulant having an encapsulant rim, the encapsulant rim is a non-horizontal portion of the encapsulant in direct contact with the support structure and having a concave surface characteristic of being formed from an elastic resilient member pressed against the support structure.

2. The system as claimed in claim 1 wherein:
   the encapsulant protects the device without obscuring an electrical contact formed adjacent thereto.

3. The system as claimed in claim 1 further comprising an inter-device structure affixed to the support structure for blocking disruptive fields.

4. The system as claimed in claim 1 wherein:
   the support structure includes a printed wiring board, a flexible circuit substrate, or a leadframe.

5. The system as claimed in claim 1 wherein:
   the device includes semiconductor chips and integrated circuit packages.

6. The system as claimed in claim 1 wherein:
   the device includes a first package and a second package.

7. The system as claimed in claim 1 wherein:
   the device includes a second package that is not coplanar with the support structure.

8. The system as claimed in claim 1 wherein:
   the integrated circuit package system includes a fan-in package-on-package structure.

9. The system as claimed in claim 1 wherein:
   the encapsulant protects the device without obscuring an electrical interconnect array formed on a substrate of a second package.

10. The system as claimed in claim 9 wherein:
    the electrical interconnect array is a ball grid array.

11. The system as claimed in claim 9 further comprising:
    an electrical interconnect formed over the electrical interconnect array.

12. The system as claimed in claim 1 further comprising an electrical contact adjacent to the device for electrically connecting additional components and packages formed over the device.

* * * * *